United States Patent [19]

Takahashi et al.

[11] Patent Number: 4,989,062
[45] Date of Patent: Jan. 29, 1991

[54] SEMICONDUCTOR INTEGRATED CIRCUIT DEVICE HAVING MULTILAYER POWER SUPPLY LINES

[75] Inventors: Hiromasa Takahashi, Ebina; Kazuyuki Kawauchi; Shigeru Fujii, both of Yokohama, all of Japan

[73] Assignee: Fujitsu Limited, Kawasaki, Japan

[21] Appl. No.: 207,488

[22] Filed: Jun. 16, 1988

[30] Foreign Application Priority Data

Jun. 19, 1987 [JP] Japan ................. 62-154009

[51] Int. Cl.$^5$ ............... H01L 27/10; H01L 23/48; H01L 29/34
[52] U.S. Cl. ......................... 357/45; 357/49; 357/54; 357/71
[58] Field of Search ............... 357/45, 45 M, 71, 49, 357/54

[56] References Cited

U.S. PATENT DOCUMENTS

| | | | |
|---|---|---|---|
| 4,654,689 | 3/1987 | Fujii ................................ | 357/45 |
| 4,661,815 | 4/1987 | Takayama et al. . | |
| 4,774,559 | 9/1988 | Culican et al. ................ | 357/45 |
| 4,857,981 | 8/1989 | Matsumoto et al. ........... | 357/45 |

FOREIGN PATENT DOCUMENTS

| | | |
|---|---|---|
| 0140584 | 5/1985 | European Pat. Off. . |
| 0163384 | 12/1985 | European Pat. Off. . |
| 0177336 | 4/1986 | European Pat. Off. . |
| 0006958 | 1/1989 | European Pat. Off. . |
| 61-156751 | 7/1986 | Japan . |

Primary Examiner—Andrew J. James
Assistant Examiner—Ngan Van Ngo
Attorney, Agent, or Firm—Armstrong, Nikaido, Marmelstein, Kubovcik & Murray

[57] ABSTRACT

A semiconductor integrated circuit device having multilayer power supply lines includes a plurality of power supply lines formed on a semiconductor chip for supplying power to the cells. The power supply lines are constructed by the multilayer structure having three different layer levels. First-level (lower) and third-level (upper) power supply lines are arranged in parallel so as to overlap each other. Second-level (intermittent) power supply lines are arranged in parallel so as to extend in a direction perpendicular to the first-level and third-level power supply lines. The overlapping first and third power supply lines are set at different potentials.

7 Claims, 5 Drawing Sheets

SEMICONDUCTOR INTEGRATED CIRCUIT DEVICE HAVING MULTILAYER POWER SUPPLY LINES

BACKGROUND OF THE INVENTION

The present invention generally relates to a semiconductor integrated circuit device having multilayer power supply lines, and in particular to a semiconductor integrated circuit device having multilayer power supply lines arranged at three or more layer levels A power supply line formed on a semiconductor chip is mainly composed of a high-voltage power supply line and a low-voltage power supply line which are arranged in a peripheral area of the semiconductor chip. A plurality of branch power supply lines extend from each of the high-voltage power supply line and the low-voltage power supply line, and pass over cells (basic cells provided in a gate array device, or a circuit block constructing an inverter, an NAND gate, an NOR gate or the like in a standard cell) arranged in the chip. The branches of the high-voltage power supply line and the low-voltage power supply line are connected to predetermined positions on the cells.

It is well known that an integrated circuit becomes more complex and a supply current fed to the integrated circuit becomes greater as the integration density of the semiconductor integrated circuit device increases. On the other hand, an increased integration density necessarily requires a decrease in the size of the integrated circuit formed in the chip. From these viewpoints, recently, there has been considerable activity in the development of a multilayer power supply line. At current, a semiconductor integrated circuit device having power supply lines arranged at three layer levels has been presented in practical use. In the conventional three-level (three-layer) power supply lines, a plurality of lower-level (first level) power supply lines and a plurality of upper-level (third level) power supply lines extend in the same direction. It is to be noted that "a level" is a term with respect to a layer. One lower-level power supply line and one upper-level power supply lines are set at the same potential, and are arranged so as to overlap each other in the elevational direction of the device. A plurality of an intermediate-level (second level) power supply lines positioned at an intermediate layer level are separated from each other with a predetermined pitch and are arranged in a direction perpendicular to the upper and lower power supply lines. Elevationally adjacent lines may be connected to each other by a contact. One upper-level power supply line may be connected to one lower-level power supply line by two different contacts, one of which is used for establishing a connection between the lower-level and intermediate-level power supply lines, and the other of which is used for establishing a connection between the intermediate-level and the upper-level power supply lines. This configuration is disclosed in U.S. Pat. No. 4,661,815.

However, the conventional multilayer power supply line structure has the following disadvantages. First, a connection path between the lower-level and the upper-level power supply lines is very long due to the layer structure that the overlapping lower-level and upper-level power supply lines are set at the same potential. Therefore, the connecting path has a large wiring resistance and therefore a current passing therethrough is considerably consumed. Secondly, as described in detail later, a large current capacity is required for the lower-level power supply lines, and therefore the lower-level power supply lines must be made relatively wide. In this case, there is less worth using the upper-level power supply line. Thirdly, the distance between power supply lines of different potentials such as a $V_{DD}$ line and a $V_{SS}$ line is great, and a coupling capacitance therebetween is therefore small. For this reason, the stabilization in the power supply voltages resulting from the capacitive coupling is less expected.

SUMMARY OF THE INVENTION

Accordingly, a general object of the present invention is to provide a semiconductor integrated circuit device having multilayer power supply lines in which the disadvantages of the conventional one have been eliminated.

A more specific object of the present invention is to provide a semiconductor integrated circuit device having multilayer power supply lines in which a connecting path for connecting power supply lines positioned at different layer levels is shortened.

Another object of the present invention is to provide a semiconductor integrated circuit device having multilayer power supply lines in which a power supply line at a lowest layer level can be formed with a decreased width of the line.

Still another object of the present invention is to provide a semiconductor integrated circuit device having multilayer power supply lines in which an increased coupling capacitance can be obtained between power supply lines of different potentials, so that stabilized power voltages can be attained.

The above objects of the present invention can be achieved by a semiconductor integrated circuit device having multilayer power supply lines comprising the following structural elements. A first insulating layer being formed on a semiconductor chip in which an integrated circuit is formed. A plurality of first power supply lines are formed by a first conductive layer formed on the first insulating layer. The first power supply lines are arranged so as to extend in parallel in a first direction. The first power supply lines comprises a first group for supplying the integrated circuit with a first power source voltage and a second group for supplying the integrated circuit with a second power source voltage. A second insulating layer is formed on the first conductive layer. A plurality of second power supply lines are formed by a second conductive layer formed on the second insulating layer. The second power supply lines are arranged so as to extend in parallel in a second direction perpendicular to the first direction. The second power supply lines comprises a first group for supplying the integrated circuit with the first power source voltage and a second group for supplying the integrated circuit with the second power source voltage. A third insulating layer is formed on the second conductive layer. A plurality of third power supply lines are formed by a third conductive layer formed on the third insulating film. Each of the third power supply lines extend so as to overlap the respective first power supply lines, and supplies the integrated circuit with the power source voltage different from that of the corresponding first power supply line. At intersecting points between the first power supply lines and the second power supply lines, one electric connection out of an electric connection between the first power supply lines and the second power supply lines which have the same potential and an electric connection between the second power supply lines and the third power supply lines which have the same potential is established.

Other objects, features and advantages of the present invention will become apparent from the following detailed description when read in conjunction with the accompanying drawings.

DETAILED DESCRIPTION

Figure 1:
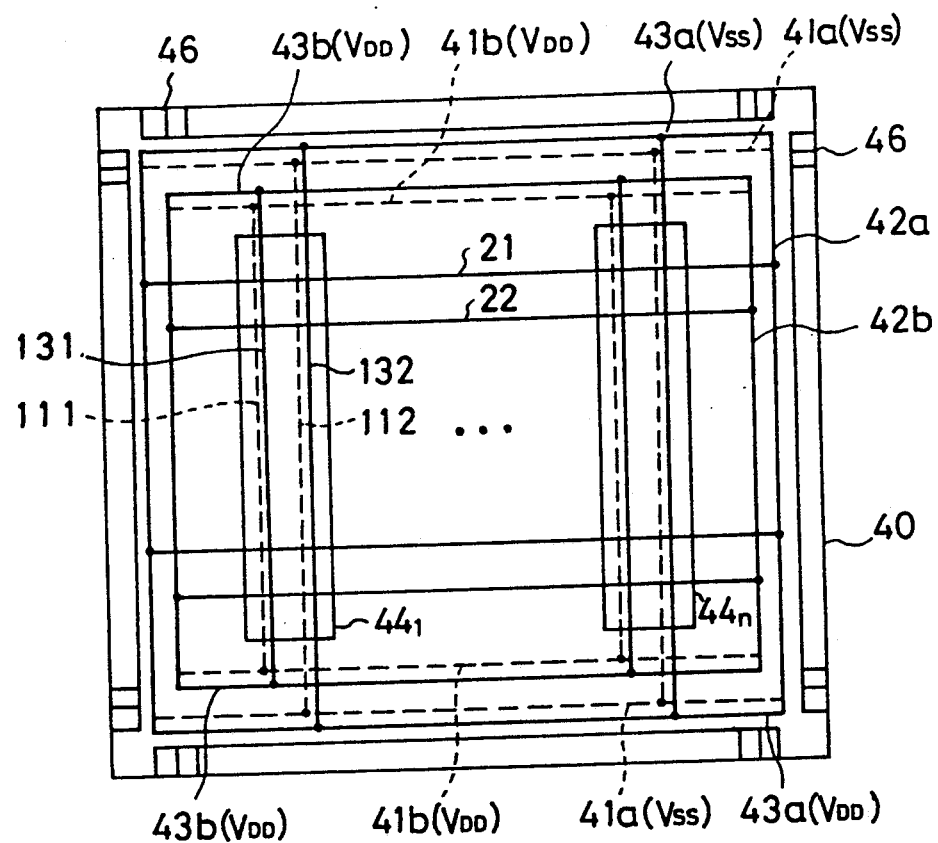
FIG. 1 is a plan view of a conventional semiconductor integrated circuits device having the multilayer power supply line structure.
Figure 2:
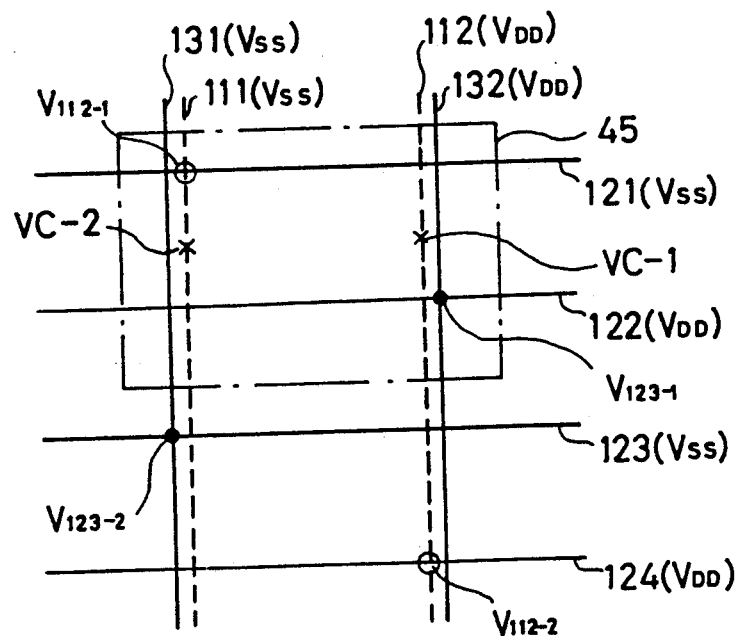
FIG. 2 is an enlarged plan view of a portion of semiconductor integrated circuit device shown in FIG. 1.
Figure 3:
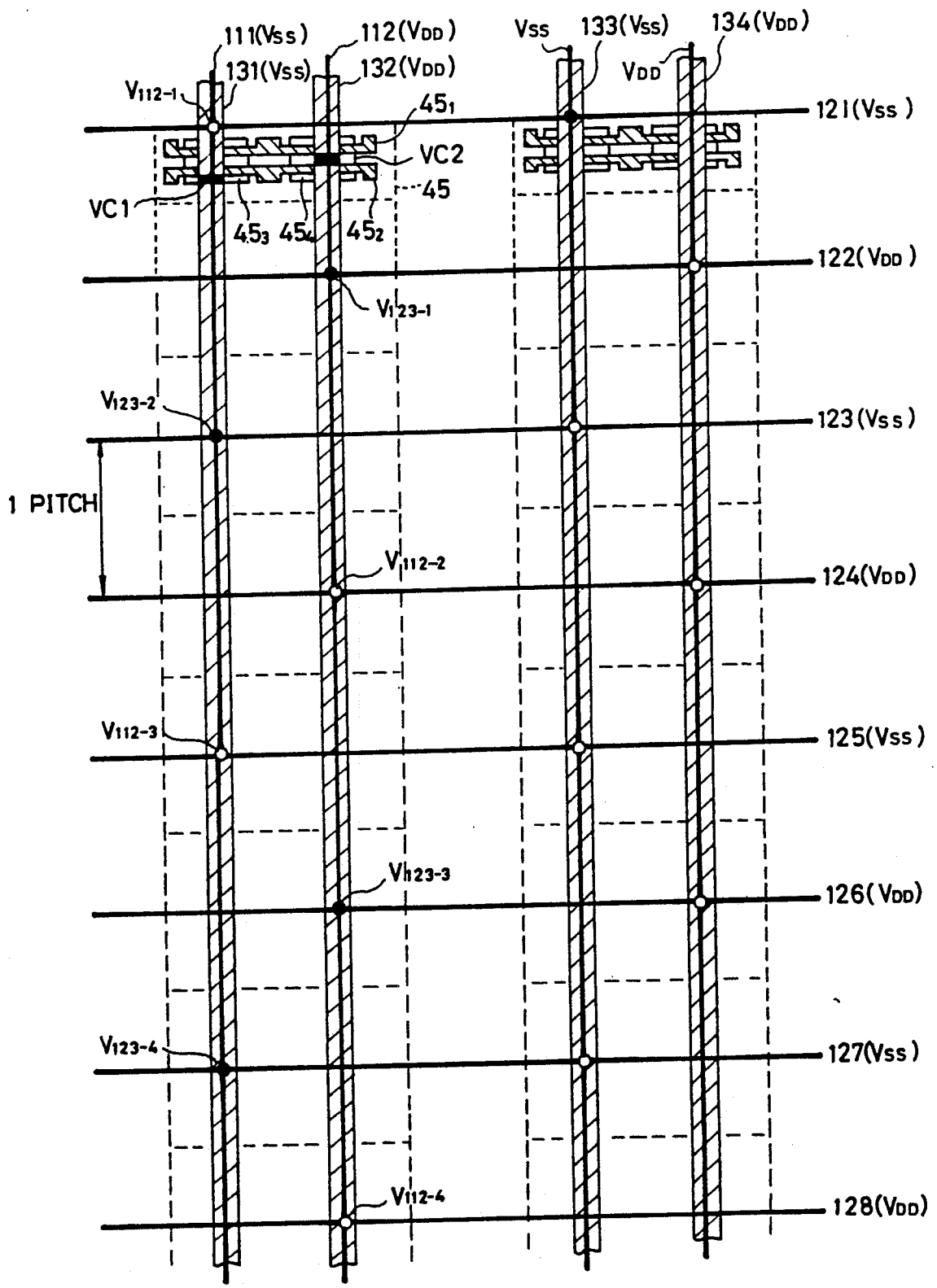
FIG. 3 is another enlarged plan view of a portion of the semiconductor integrated circuit device shown in FIG. 1.

To facilitate the understanding of the present invention, a brief description is given of a conventional semiconductor integrated circuit device having multilayer power supply lines with reference to FIGS. 1 through 3.

FIG. 1 is a plan view of a conventional master slice type semiconductor integrated circuit device having the multilayer power supply lines arranged at three different layer levels. Referring to FIG. 1, a plurality of input/output cells 46 are arranged along ends of a semiconductor chip 40. Bonding pads provided in the vicinity of ends of the chip 40 are not shown for the sake of simplicity. Low-voltage power supply lines ($V_{SS}$ lines) composed of power supply lines 41a and 43a are arranged along the arrangements of the I/O cells 46. There are also arranged a plurality of high-voltage power supply lines 41b and 43b in parallel to the power supply lines 41a and 43a. The power supply lines 41a and 43a of the same potential ($V_{SS}$) are positioned at the first and third-levels and are arranged in parallel so as to overlap each other. Hereafter, the power supply lines 41a and 43a are referred to as a first-level $V_{SS}$ line and a third-level $V_{SS}$ line, respectively. Likewise, the power supply lines 41b and 43b of the same potential ($V_{DD}$) are arranged in parallel so as to overlap each other. Hereafter, the power supply lines 41b and 43b are referred to as a first-level $V_{DD}$ line and a third-level $V_{DD}$ line, respectively. A plurality of high-voltage power supply lines branch from the first-level and third-level $V_{DD}$ lines 41b and 43b, and pass over basic cell columns $44_l$, ..., $44_n$. Each of the basic cell columns $44_l$, ..., $44_n$ has a series of basic cells. For example, high-voltage power supply lines 111 and 131 extend from the first-level and third-level $V_{DD}$ lines 41b and 43b, respectively, and pass over the basic cell column $44_1$. Similarly, low-voltage power supply lines 112 and 132 extend from the first-level and third-level $V_{SS}$ lines 41a and 43a, and pass over the basic cell column $44_1$. Further, the semiconductor device includes a plurality of second-level power supply lines 42a and 42b which are arranged in parallel to the basic cell column $44_l$–$44_n$. The second-level lines 42a and 42b are $V_{SS}$ and $V_{DD}$ lines, respectively. A plurality of second-level power supply lines branch from the second-level lines 42a and 42b. For example, second-level power supply lines 21 and 22 are arranged so as to be connected to the second-level lines 42a and 42b, respectively.

As described before, the multilayer power supply line structure is employed in order to overcome the reciprocity between the increase in the integration density and the scale-down in the power supply lines.

FIGS. 2 and 3 are enlarged views for more clearly showing the relationship among the power supply lines shown in FIG. 1. As shown in FIG. 2, the first-level $V_{SS}$ line 111 and the third-level $V_{SS}$ line 131 are arranged in parallel so as to overlap each other. It is to be noted that the overlapping lines 111 and 131 are set at the same potential $V_{SS}$. Similarly, the first-level and third-level $V_{DD}$ lines 112 and 132 are arranged in parallel so as to overlap each other. It is to be noted that the lines 112 and 132 are set at the same potential. The first-level $V_{SS}$ line 111 and the first-level $V_{DD}$ line 112 are electrically connected to a basic cell 45 which has gate electrodes $45_1$ and $45_2$, and impurity diffusion regions $45_3$ and $45_4$. Second-level power supply lines 121 through 128 are arranged perpendicular to the first-level and third-level power supply lines such as the lines 111 and 131. The second-level power supply lines are used alternately as the $V_{DD}$ line and $V_{SS}$ line.

An electric connection between the power supply lines which are elevationally adjacent to each other is established by a contact constructed by a contact hole into which a metallization of the power supply line is filled. For example, with respect to the $V_{SS}$ lines, a connection between the third-level $V_{SS}$ line 131 and the second-level $V_{SS}$ line 123 is established by a contact $V_{123\text{-}2}$, and a connection between the second-level $V_{SS}$ line 121 and the first-level $V_{SS}$ line 111 is established by a contact $V_{112\text{-}1}$. With respect to the $V_{DD}$ lines, a connection between the third-level $V_{DD}$ line 132 and second-level $V_{DD}$ line 122 is established by a contact $V_{123\text{-}1}$, and the second-level $V_{DD}$ line 124 and the first-level $V_{DD}$ line 112 is established by a contact $V_{112\text{-}2}$.

Generally, it is impossible to connect wiring layers positioned at three or more layer levels to each other by one contact. For example, it is impossible to mutually connect lines 112, 122 and 132 set at the $V_{DD}$ potential by one contact. This is because a metallization of the third-level line 132 is greatly recessed in a through hole which is formed so as to penetrate the third, second and first-level layers, and thereby an upper edge of the through hole becomes exposed without being covered with the metallization. For this reason, the use of the through hole is limited to the connection between only two elevationally adjacent lines.

As shown in FIG. 3, a contact between the first-level line and the second-level line is provided every four pitches (one pitch corresponds to a distance between adjacent second-level lines). For example, the contacts $V_{112\text{-}2}$ and $V_{112\text{-}4}$ with respect to the first-level $V_{DD}$ line 112 are separated from each other by four pitches. Similarly, the contacts $V_{123\text{-}1}$ and $V_{123\text{-}3}$ with respect to the third-level $V_{DD}$ line 132 are separated from each other by four pitches That is, it is impossible to form contacts of the same type such as $V_{123\text{-}1}$ and $V_{123\text{-}3}$ by a pitch smaller than four pitches. Therefore, in the case where the power is supplied to cells from a third-level power supply line, a connecting path extending therebetween is greatly long. Hence, a current to be supplied to a cell through the third-level power supply line is greatly consumed.

Generally, a circuit to be supplied with the power is connected directly to the first-level power supply line. In the example of FIG. 3, there are formed eight basic cells between the through holes $V_{112-2}$ and $V_{112-4}$ with respect to the first-level $V_{DD}$ line 112. Therefore, the line 112 must have a current capacity which corresponds to a power necessary for driving the eight basic cells. In other words, it may be said that the first-level $V_{DD}$ line 112 is required to have a current capacity corresponding to four pitches. For this reason, the first-level $V_{DD}$ line 112 must be formed with a relatively wide wiring pattern. This holds true for the other first-level power supply lines, and considerably reduces advantageous effects provided by the use of the third-level power supply lines. It is to be noted that one of the objectives of the use of the multilayer structure intends to uniformly pass the current through each line.

Moreover, there is a great distance between mutually adjacent $V_{DD}$ and $V_{SS}$ lines such as the lines 111 and 112. This means that a coupling capacitance between the power supply lines of different potentials is small. It is to be noted that power supply voltages can be more stabilized as the coupling capacitance increases. Therefore, it is difficult to obtain the stabilized power supply voltages with the conventional multilayer power supply line structure.

The present invention is directed to overcoming the above-described disadvantages.

A preferred embodiment of the present invention is now described, by referring to FIGS. 4 through 7.

Figure 4:
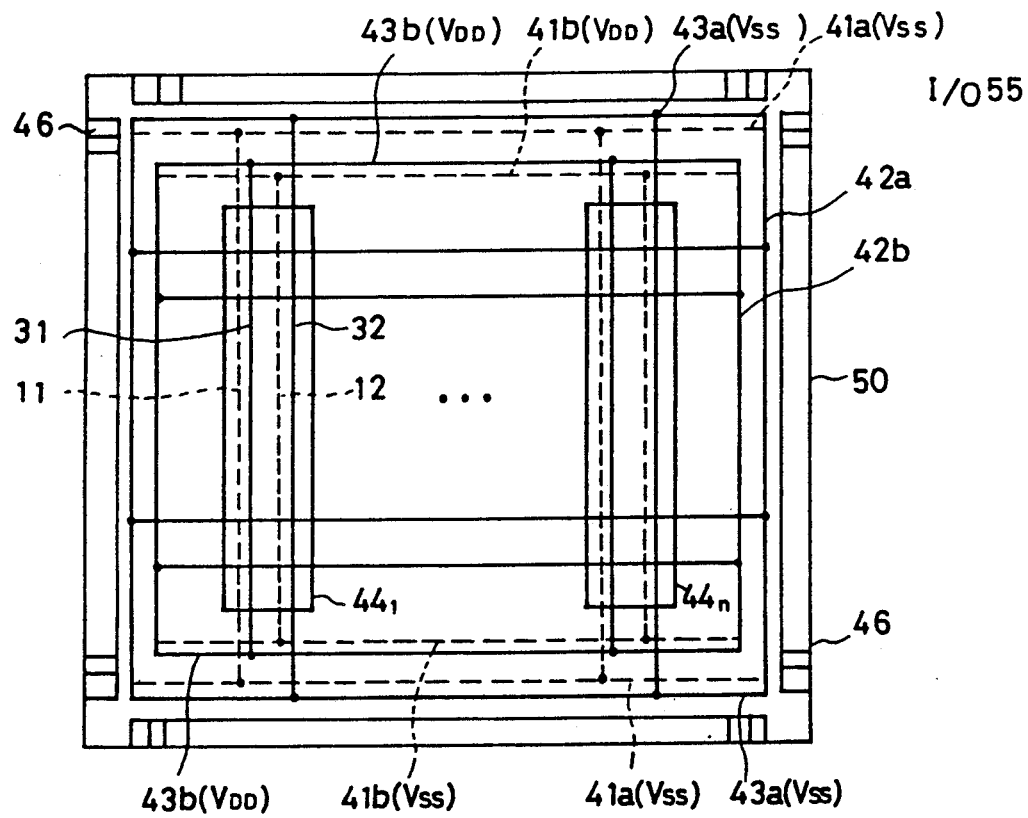
FIG. 4 is a plan view of a semiconductor integrated circuit device according to a preferred embodiment of the present invention.
Figure 5:
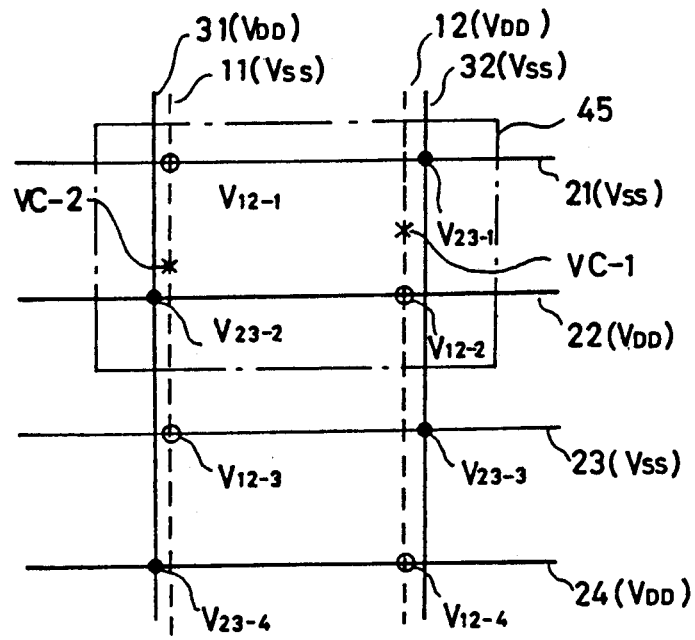
FIG. 5 is an enlarged plan view of a portion of the embodiment shown in FIG. 4.
Figure 6:
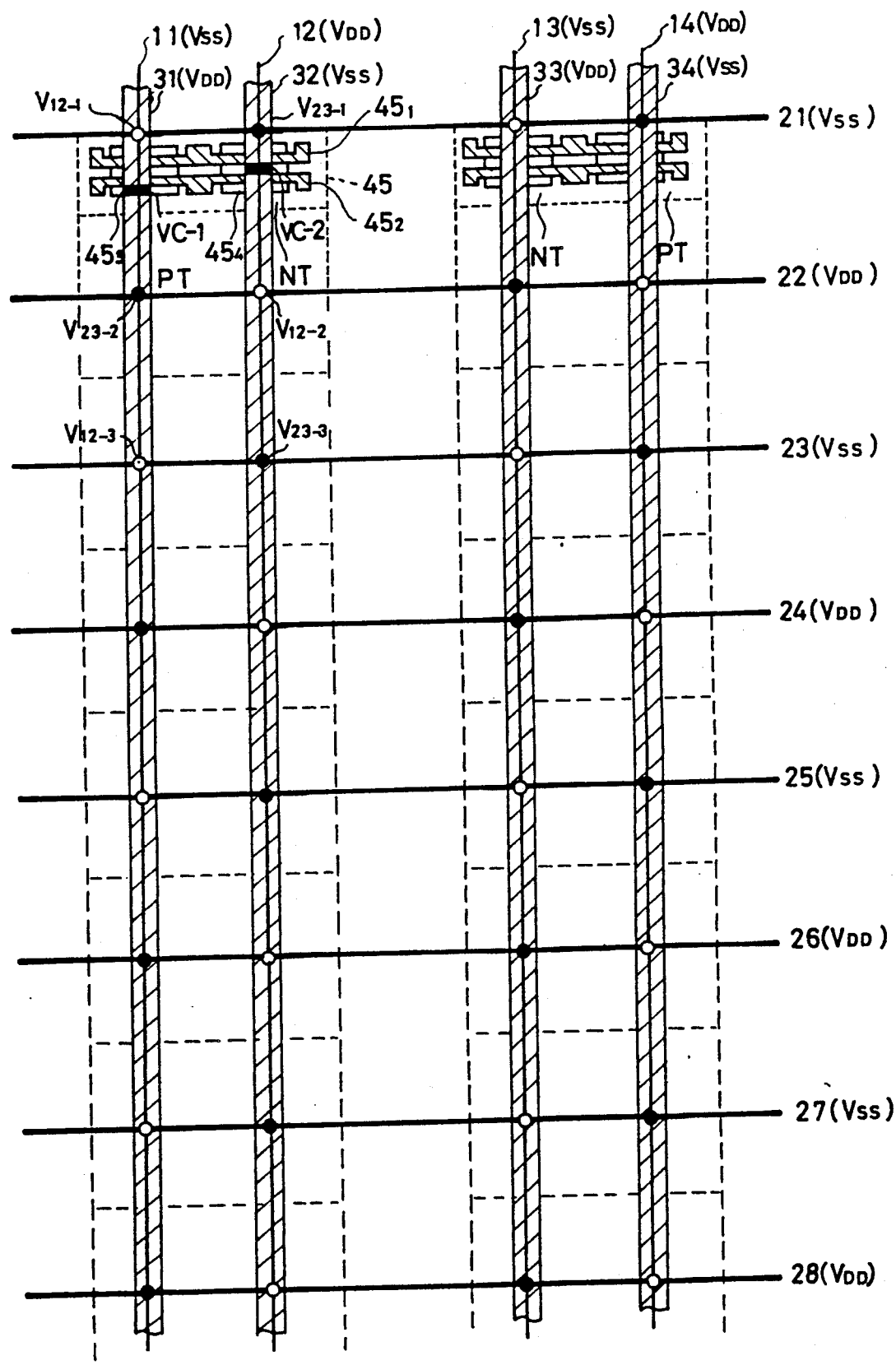
FIG. 6 is another enlarged plan view of a portion of the embodiment shown in FIG. 4.

FIG. 4 is a plan view of an preferred embodiment of the present invention. In FIG. 4, the same reference numerals as those in the previous figures denote the same elements. FIGS. 5 and 6 are enlarged views of FIG. 4 which more clearly show the relationship among power supply lines provided in a semiconductor chip 50. Referring to FIG. 4, power supply lines 11 and 31 which overlap each other branch from the first-level $V_{SS}$ line 41a and the third-level $V_{DD}$ line 43b, respectively. That is, the power supply line 11 is a first-level $V_{SS}$ line, and the power supply line 31 is a third-level $V_{DD}$ line. The power supply lines 11 and 31 are arranged over the basic cell column $44_1$ in parallel so as to overlap each other. Power supply lines 12 and 32 branch from the first-level $V_{DD}$ line 41b and the third-level $V_{DD}$ line 43a, respectively. That is, the power supply line 12 is a first-level $V_{DD}$ line, and the power supply line 32 is a third-level $V_{DD}$ line. The power supply lines 12 and 32 are arranged over the basic cell column $44_1$ in parallel so as to overlap each other. It is to be noted that the overlapping power supply lines are set at different potentials. This is clearly distinct from the structure of FIG. 2. The different potentials means not only a difference in the potentials but also a difference in the polarity of the potentials. Second-level power supply lines 21 through 28 (FIG. 6) are arranged in the direction perpendicular to the basic column cells $44_1$-$44_n$.

As clearly illustrated in FIGS. 5 and 6, the third-level $V_{SS}$ line 32 is connected to the second-level $V_{SS}$ line 21 by a contact $V_{23-1}$. The second-level $V_{SS}$ line 21 is connected to first-level $V_{SS}$ line 11 by a contact $V_{12-1}$. The third-level $V_{DD}$ line 31 is connected to the second-level $V_{DD}$ line 22 by a contact $V_{23-2}$, which is connected to the first-level $V_{DD}$ line 12 by a contact $V_{12-2}$. The first-level $V_{SS}$ and $V_{DD}$ lines 11 and 12 are connected to the basic cell 45 by the contacts VC-1 and VC-2, respectively. In FIG. 6, a symbol NT denotes an N-channel metal oxide semiconductor (MOS) transistor and a symbol PT denotes a P-channel metal oxide semiconductor (MOS) transistor. The basic cell 45 is a complementary MOS transistor and includes two P-channel MOS transistors PT and two N-channel MOS transistors.

Figure 7A:
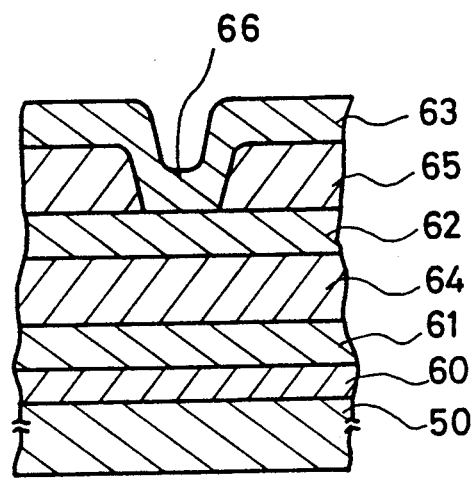
FIGS. 7A and 7B are elevational cross sectional views of the embodiment shown in FIG. 4.
Figure 7B:
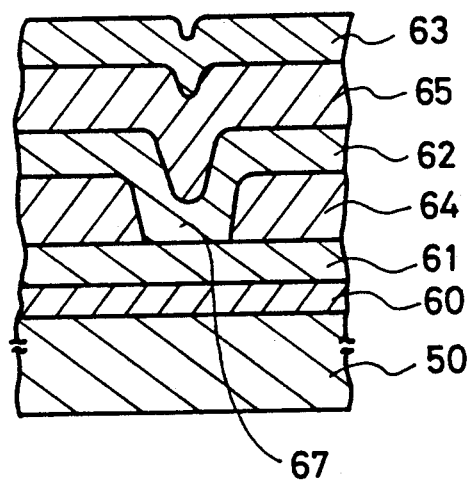

FIGS. 7A and 7B are elevational cross sectional views of the multilayer structure of the embodiment. FIG. 7A shows a contact for establishing a connection between a third-level layer 63 and a second-level layer 62. The third-level power supply lines are formed by the third-level layer 63, and the second-level power supply lines are formed by the second-level layer 62. A contact hole 66 is formed in an interlayer insulating layer 65, and the material forming the third-level layer 63 is filled into the contact hole 66. A first-level layer 61 is formed on an insulating film 60 formed on the semiconductor chip 50. The first-level power supply lines are formed by the first-level layer 61. FIG. 7B shows a contact for establishing a connection between the first-level layer 61 and the second-level layer 62. A contact hole 67 is formed in an interlayer insulating layer 64, and the material forming the second-level layer 62 is filled into the contact hole 67.

According to the multilayer power supply lines shown in FIG. 4, it becomes possible to connect the power supply lines 21, 22, 31 and 32 which pass over the cell 45 to the basic cell 45 without using power supply lines which do not pass over the cell 45. That is, the $V_{SS}$ power voltage supplied from the third-level $V_{SS}$ line 32 is applied to the cell 45 through the contact line $V_{23-1}$, the second-level $V_{SS}$ line 21, the contact $V_{12-1}$ and the first-level $V_{SS}$ line 11. Similarly, the $V_{DD}$ power voltage supplied from the third-level $V_{DD}$ line 31 is applied to the cell 45 through the contact $V_{23-2}$, the second-level $V_{DD}$ line 22, the contact $V_{12-2}$, and the first-level $V_{DD}$ line 12. As a result, a connecting path between a power supply line and a basic cell can be shortened and thereby a thinner wiring pattern can be employed for the first-level power supply line. On the other hand, in the conventional structure shown in FIG. 3, the $V_{SS}$ power voltage is applied to the cell 45 from a third-level $V_{SS}$ line 133, and the $V_{DD}$ power voltage is applied to the cell 45 from a third-level $V_{DD}$ line 134. It is to be noted that the lines 133 and 134 do not pass over the cell 45.

As clearly shown in FIG. 6, a contact between the power supply lines of the same potential can be formed for every other pitch by which the second-level power supply lines such as the lines 21, 22, 23 and 24 are arranged in the direction perpendicular to the first-level and third-level power supply lines such as the lines 11 and 31. That is, the present embodiment has a double efficiency in the formation of contacts, compared with the arrangement shown in FIGS. 2 and 3 in which the contact is provided for ether four pitches. This means that the multilayer structure of the present invention can decrease the number of the second-level power supply lines to one half of that for the conventional multilayer structure. Of course, it is possible to arrange the number of the second-level lines which is identical to that for the conventional structure. In this case, auxiliary second-level lines may be used as signal lines. In addition, the multilayer structure of the embodiment can make use of the first-level line having a current capacity half of that of the conventional first-level line.

This is because as shown in FIGS. 5 and 6, there are only four basic cells connectable to the first-level line 11 between the contacts $V_{12\text{-}1}$ and $V_{12\text{-}3}$, whereas there are eight basic cells therebetween.

Moreover, the crosstalk between the signal line arranged at the second-level and each of the first-level and third-level power supply lines can be considerably reduced, because power supply lines of the different potentials are arranged elevationally on both the sides of the signal lines. Furthermore, the coupling capacitance between the power supply lines of the different potentials, such as the lines 11 and 31 and the lines 12 and 32, can be considerably increased and thereby the power voltages can be greatly stabilized. This is because the $V_{DD}$ and $V_{SS}$ lines overlap each other and thus the distance therebetween is greatly reduced, compared with the conventional multilayer structure. It is to be appreciated that the stabilization of the power voltages due to the coupling capacitance between the power supply lines greatly contributes to speeding-up of operation of integrated circuits. It is also to be appreciated that a logic circuit pattern in conformity with the conventional bilayer structure can be applied to the production process of the three-level layer structure as it is. This is because the power supply line of the upper layer can be connected "directly" to the power supply line of the lower layer.

The embodiment described above is constructed by the multilayer power supply line structure having three different layer levels. According to the present invention, a semiconductor integrated circuit device having the multilayer structure having four or more different levels can be made. In the multilayer structure having four levels, a plurality of fourth-level power supply lines are arranged in parallel so as to overlap with the second-level power supply lines. In this case, the second-level and fourth-level power supply lines overlap each other and are set at the same potential.

The present invention is not limited to the embodiment, and variations and modifications may be made without departing from the scope of the present invention.

What is claimed is:

1. A semiconductor integrated circuit device having multilayer power supply lines comprising:
   a semiconductor chip in which an integrated circuit is formed;
   a first insulating layer formed on the semiconductor chip;
   a plurality of first power supply lines formed by a first conductive layer formed on the first insulating layer, the first power supply lines being arranged so as to extend in parallel in a first direction, the first power supply lines comprising a first group for supplying the integrated circuit with a first power source voltage and a second group for supplying the integrated circuit with a second power source voltage;
   a second insulating layer formed on the first conductive layer;
   a plurality of second power supply lines formed by a second conductive layer formed on the second insulating layer, the second power supply lines being arranged so as to extend in parallel in a second direction perpendicular to the first direction, the second power supply lines comprising a first group for supplying the integrated circuit with the first power source voltage and a second group for supplying the integrated circuit with the second power source voltage;
   a third insulating layer formed on the second conductive layer;
   a plurality of third power supply lines formed by a third conductive layer formed on the third insulating film, each of the third power supply lines extending so as to overlap a corresponding one of said first power supply lines, and supplying the integrated circuit with the power source voltage different from that of said corresponding one of said first power supply lines,
   said plurality of second power supply lines crossing said plurality of first power supply lines through said first insulating layer and crossing the plurality of third power supply lines through said third insulating layer;
   a first electrical contact formed at an intersecting point where one of the first power supply lines and one of the second power supply lines, having a potential identical to said one of the first power supply lines, cross through said second insulating layer; and
   a second electrical contact formed at an intersecting point where one of the second power supply lines and one of the third power supply lines, having a potential identical to said one of the second power supply lines, cross through said third insulating layer.

2. A semiconductor integrated circuit device as claimed in claim 1, wherein neighboring lines of said second power supply lines have different potentials.

3. A semiconductor integrated circuit device as claimed in claim 1, wherein first contacts for establishing connections between the first power supply lines and the second power supply lines which have the same potential are formed for every other pitch, and second contacts for establishing connections between the third power supply lines and the second power supply lines which have the same potential are formed for every other pitch, one pitch corresponding to a separation between the neighboring lines of said second power supply lines.

4. A semiconductor integrated circuit as claimed in claim 1, wherein the first and second power source voltages comprise a high-voltage power source voltage and a low-voltage power source voltage, respectively.

5. A semiconductor integrated circuit device as claimed in claim 1, wherein the semiconductor integrated circuit device is a master slice type integrated circuit device.

6. A semiconductor integrated circuit device as claimed in claim 5, wherein a plurality of basic cells including a group of basic elements are formed in the semiconductor chip so as to form a plurality of columns of basic cells, and wherein the first and third power supply lines extend above the columns of the basic cells.

7. A semiconductor integrated circuit device as claimed in claim 6, wherein one of said first power supply lines related to either one of the first group or the second group and one of said third power supply lines related to the group different from the group of said one of said first power supply lines are arranged above each of the columns of the basic cells.

* * * * *